United States Patent
Lai

(10) Patent No.: US 7,183,808 B2
(45) Date of Patent: Feb. 27, 2007

(54) CIRCUIT FOR POWER MANAGEMENT OF STANDARD CELL APPLICATION

(75) Inventor: Fang-Shi Lai, Chia Yi (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 36 days.

(21) Appl. No.: 10/898,786

(22) Filed: Jul. 26, 2004

(65) Prior Publication Data

US 2006/0017467 A1    Jan. 26, 2006

(51) Int. Cl.
*H03K 19/20*    (2006.01)

(52) U.S. Cl. .......................... 326/112; 326/33; 326/119

(58) Field of Classification Search ............ 326/15–98, 326/112, 119, 121
See application file for complete search history.

(56) References Cited

U.S. PATENT DOCUMENTS

| | | | | |
|---|---|---|---|---|
| 5,614,847 A * | 3/1997 | Kawahara et al. | .......... | 326/121 |
| 5,615,162 A | 3/1997 | Houston | .......... | 365/226 |
| 6,208,170 B1 * | 3/2001 | Iwaki et al. | .......... | 326/121 |
| 6,287,920 B1 | 9/2001 | Chatterjee et al. | .......... | 438/276 |
| 6,500,715 B2 * | 12/2002 | Matsuzaki et al. | .......... | 438/275 |
| 6,657,887 B2 | 12/2003 | Higeta et al. | .......... | 365/156 |
| 6,664,608 B1 | 12/2003 | Burr | .......... | 257/549 |
| 6,667,648 B2 | 12/2003 | Stout et al. | .......... | 327/333 |
| 6,707,702 B1 | 3/2004 | Komatsuzaki | .......... | 365/145 |
| 2002/0008545 A1 * | 1/2002 | Zama et al. | .......... | 326/93 |
| 2004/0196082 A1 | 10/2004 | Pacha et al. | .......... | 327/215 |

OTHER PUBLICATIONS

USPTO Office Action mailed Nov. 14, 2005 for U.S. Appl. No. 10/898,750, filed Jul. 26, 2004.
USPTO Office Action mailed Dec. 14, 2005 for U.S. Appl. No. 10/899,320, filed Jul. 26, 2004.
"Design and Implementation of Differential Cascode Voltage Switch with Pass-Gate (DCVSPG) Logic for High-Performance Digital Systems" Lai et al., 1997; pp. 563-573, no month.

* cited by examiner

*Primary Examiner*—Anh Q. Tran
(74) *Attorney, Agent, or Firm*—Thomas, Kayden, Horstemeyer & Risley

(57) ABSTRACT

A power management circuit for logic cells. A logic cell is operated in normal or standby modes according to a power control signal. The logic cell includes an output terminal and a power input terminal. A switch is coupled between a power voltage, the power control signal and the power input terminal. That switch is turned off to disconnect the power voltage and the logic cell when the power control signal is at a predetermined level. This results in the logic cell operating in standby mode. A latch circuit is coupled between the power voltage and the output terminal to preserve the voltage level of the output terminal when the logic cell operates in standby mode.

12 Claims, 3 Drawing Sheets

US 7,183,808 B2

CIRCUIT FOR POWER MANAGEMENT OF STANDARD CELL APPLICATION

BACKGROUND OF THE INVENTION

1. Technical Field

The present disclosure relates in general to a circuit for power management of standard cell application. In particular, the present disclosure relates to a circuit for power management of standard cell application using a head switch and a latch.

2. Description of the Related Art

Standby leakage problems, occurring when a chip is in standby mode, are serious concerns in very deep submicron technology with device size reductions. FIG. 1 shows current leakage sources in a transistor 10. The transistor 10 comprises a gate 12, a source 14, a drain 16 and a well 18. Current leakage is caused by junction leakage $I_1$, weak inversion $I_2$, drain induced barrier lowering $I_3$, gate induced drain leakage $I_4$, punchthrough $I_5$, narrow width effect $I_6$, gate oxide tunneling $I_7$ and hot carrier injection $I_8$.

The increased subthreshold leakage and gate leakage current not only increase the IC reliability issues, but also increase the package cost in order to handle the excess power dissipation. The rapidly increased leakage current leads the huge power consumption when the IC chip is getting bigger, taster and denser. Power management technique becomes the required design issue. Recently, there were several patents declared to handle the huge power consumption problems. However, they are all existed some design issues and limitations.

U.S. Pat. No. 6,287,920 to Chatterjee, et al. discloses a method for forming multiple threshold voltage integrated into circuit transistors. Angled pocket type implants are formed to create asymmetric regions. The source and drain regions are connected such that multiple threshold voltage transistors are formed. Several different threshold voltage libraries must be employed to implement the multiple threshold voltage method. In addition, power saving is typically limited and often insufficient. The multiple threshold voltage method requires extra masks for different threshold voltage and power.

U.S. Pat. No. 6,664,608 to Burr, et al. discloses a back-biased MOS device. Both of p-wells and n-wells are formed on a front side of a bulk material. The N devices and P devices are formed respectively within the P-wells or N-wells. The P-wells or N-wells are electrically isolated from one another and are routed to the different potentials to vary their threshold voltages. The changed threshold voltages will than be used to reduce their subthreshold leakage currents.

However, disadvantages of the back-biased method include the need for additional charge pumps or multiple power supplies to apply extra bias to the well and/or substrate, the junction or gate oxide breakdown concerns, the excessive time required to charge or discharge between different modes, the required deep N-well process, and the design complexity.

U.S. Pat. No. 6,667,648 to Stout, et al. discloses a voltage island communications circuit. An integrated circuit comprises a first circuit powered by a first power supply. The first circuit sends a first signal referenced to the voltage of the first power supply to a second circuit powered by a second power supply. The second circuit receives the first signal and converts the first signal to a second signal of the same logical value as the first signal and is referenced to the voltage of the second power supply. However, complicated design and complex tools are required by the voltage island method. In addition, the voltage island method cannot solve leakage problems in most active circuit blocks.

The multiple Vt method needs multiple standard cell libraries and cannot save enough power when the chip has so many critical paths. The back-biased MOS method has the junction breakdown and gate oxide breakdown concerns and has the limited power saving in the very deep submicron technology. The very deep submicron technology has the less efficient threshold voltage variation by using the backed-gate bias. Both of those methods cannot solve the gate leakage problem which because major concern in the 90 nm technology and beyond. The voltage island method, however, needs the complexity of software and hardware interaction which tends to increase the design difficulty.

SUMMARY

One object, among others, of the present invention is thus to provide a circuit for power management of standard cell applications using switches to disconnect the logic cells from a supplied voltage, and latches to preserve the output state of the logic cells.

To achieve the above-mentioned object, some embodiments of the present invention provide a power management circuit for logic cells. The power management circuit switches the logic cell from a normal mode to a standby mode according to a power control signal. The logic cell includes an output terminal and a power input terminal. A switch coupled between a power voltage, the power control signal and the power input terminal is turned off to disconnect the power voltage and the logic cell when the power control signal is at a predetermined level, such that the logic cell operates in the standby mode. A latch circuit is coupled between the power voltage and the output terminal to preserve the voltage level of the output terminal when the logic cell operates in standby mode.

BRIEF DESCRIPTION OF THE DRAWINGS

Various aspects of the present invention will become more fully understood from the detailed description, given below, and the accompanying drawings. The drawings and description are provided for purposes of illustration only and, thus, are not intended to be limiting of the present invention.

DETAILED DESCRIPTION

First Embodiment

Figure 1:
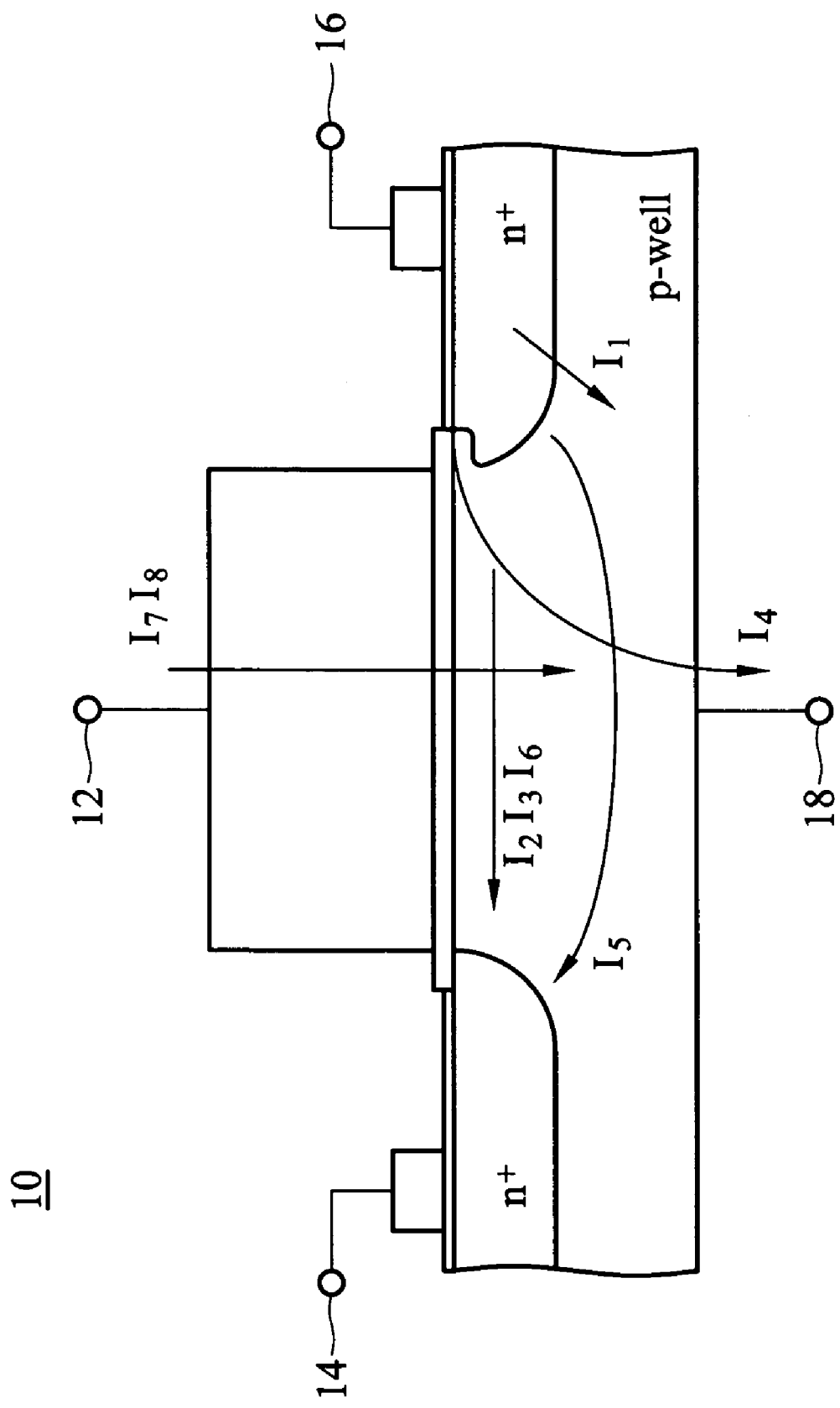
FIG. 1 shows current leakage sources in a transistor.
Figure 2:
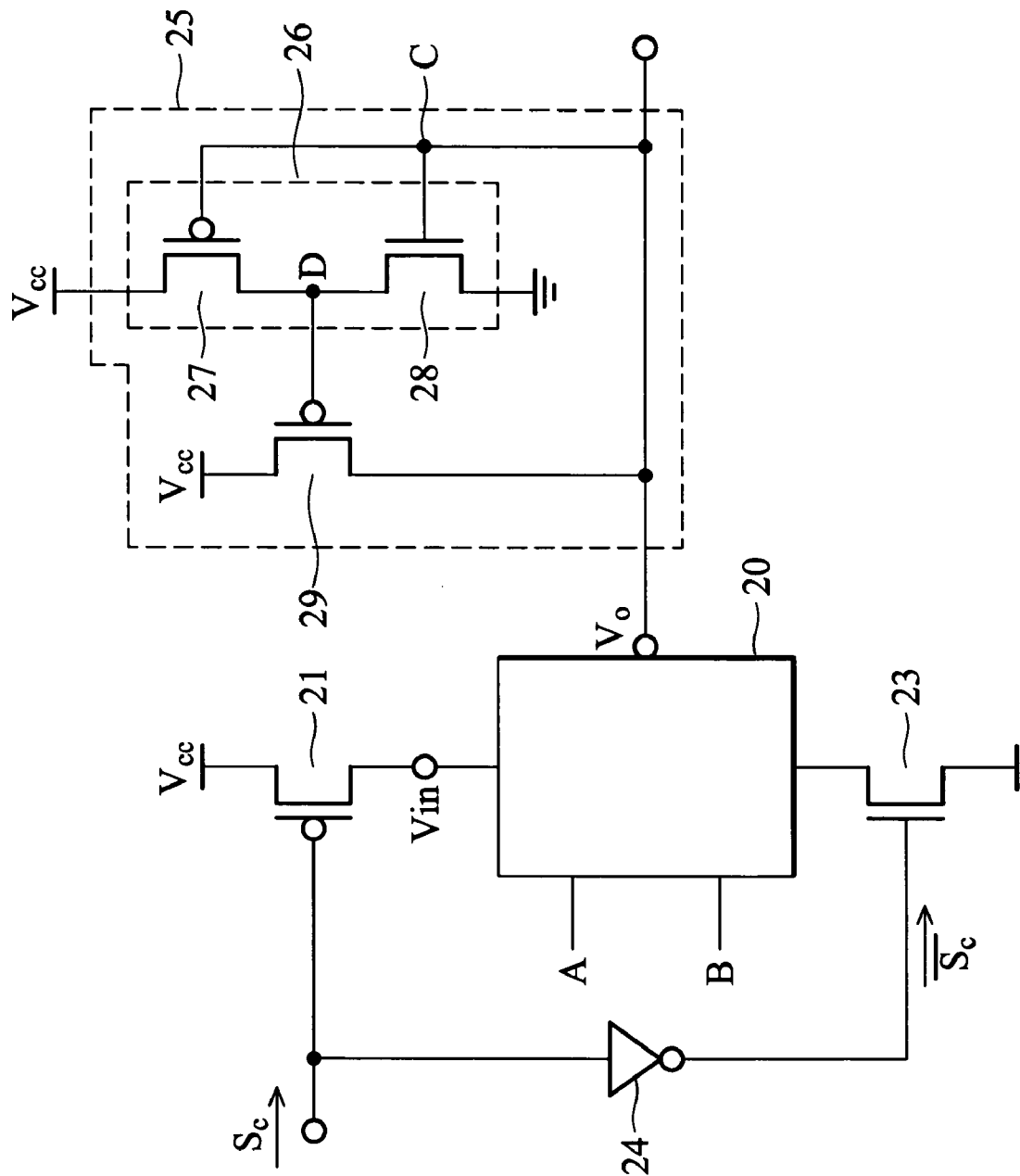
FIG. 2 is a circuit diagram of a power management circuit according to a first embodiment of the present invention.

FIG. 2 is a circuit diagram of a power management circuit according to a first embodiment of the present invention. As shown here, the circuit diagram shows a logic cell 20, an inverter 24, a latch circuit 26, a voltage source Vcc, a PMOS transistor 21 (head switch), and an NMOS transistor 23 (foot switch). The logic cell 20 comprises two input signal terminals, A and B, a power input terminal Vin, and an output terminal Vo. The latch circuit 25 comprises a PMOS tran sistor 29 and an inverter circuit 26. The inverter circuit 26 comprises a PMOS transistor 27 and an NMOS transistor 28. The power management circuit, according to the first embodiment of the present invention, switches logic cell 20 between normal and standby modes according to a power control signal Sc. Here, logic cell 20 comprises a plurality of internal transistors (not shown), with each internal transistor having a gate oxide layer and a threshold voltage, as known to those having skill in the art.

PMOS transistor 21 (head switch) is coupled between a power voltage Vcc and the power input terminal Vin. The gate of the PMOS transistor 21 receives the power control signal Sc. NMOS transistor 23 (foot switch) is coupled between a ground voltage and logic cell 20. PMOS transistor 21 is turned off to disconnect a current path between logic cell 20 and Vcc. Inverter 24 is connected between the gate of PMOS transistor 21 and the gate of NMOS transistor 23. The inverter 24 inverts the power control signal Sc to a reverse power control signal $\overline{Sc}$. The reverse power control signal $\overline{Sc}$ is applied to the gate of the NMOS transistor 23. Thus, when Sc is low, PMOS transistor 21 and NMOS transistor 23 are turned off to disconnect the current path between Vcc and ground. Consequently, logic cell 20 operates in standby mode.

Latch circuit 25 is coupled between Vcc and the output terminal Vo of logic cell 20, thereby preserving the voltage level of the output terminal Vo. The source of PMOS transistor 27 of inverter circuit 25 is coupled to power voltage Vcc. The drain of PMOS transistor 27 is coupled to both the gate of PMOS transistor 29. The source of NMOS transistor 28 is coupled to ground. The gate of NMOS transistor 28 is coupled to the gate of PMOS transistor 27. The drain of NMOS transistor 28 is coupled to the connection point of the gate of PMOS transistor 29 and the drain of PMOS transistor 27. Here, the connection point of the gates of PMOS transistor 27 and NMOS transistor 28 is designated as input terminal C. The connection point of the drains of PMOS transistor 27 and NMOS transistor 28 is designated as output terminal D. PMOS transistor 29 has a gate coupled to the output terminal D, a source coupled to the power voltage Vcc, and a drain coupled to the output terminal of the logic cell Vo. The threshold voltages of NMOS transistors 23 and 28, and PMOS transistors 21, 27 and 29 are higher than those of the internal transistors. Alternatively, the oxide layers of NMOS transistors 23 and 28, and PMOS transistors 21, 27 and 29 are thicker than those of the internal transistors.

When power control signal Sc is low, PMOS transistor 21 and NMOS transistor 23 are turned on, and PMOS transistors 27 and 29 and NMOS transistor 28 act as extra load. Thus, logic cell 20 outputs data with a predetermined logic level from output terminal Vo according to input signals respectively applied to input signal terminals A and B. When power control signal Sc switches to high voltage level, PMOS transistor 21 and NMOS transistor 23 are turned off. Thus, logic cell 20 operates in standby mode. In addition, the logic level (high logic level as an example) of output terminal Vo is applied to input terminal C of the inverter circuit 26. Thus, the logic level at output terminal D of the inverter circuit 26 is low, such that PMOS transistor 29 is turned on to maintain the high logic level of output terminal Vo of logic cell 20. Here, the dimension of PMOS transistors 27 and 29 and NMOS transistor 28 are small because they function to maintain the high stage of output terminal Vo during standby mode. In addition, when the low logic level of output terminal Vo is low, PMOS transistor 29 is turned off. Thus, a low logic level of output terminal Vo is presented and maintained. It is noted that the logic level of output terminal Vo can be driven low because the dimension of PMOS transistors 27 is small. In addition, the driving ability of logic cell 20 greatly exceeds that of latch circuit 25 because dimension or W/L ratio of PMOS 29 is small. Thus, logic cell 20 dominates the logic level of Vo in normal mode. In the normal mode, the driving ability of latch circuit 25 can be ignored due to its much smaller driving ability in compare with that of logic cell 20. Terminal Vo goes high as logic cell 20 outputs high, and goes low as logic cell 20 outputs low. Nevertheless, in standby mode, there is no more driving ability in logic cell 20 because its power supply is turned off by the head switch and the foot switch. Thus, latch circuit 25 dominates the logic level of Vo in standby mode. If terminal Vo is initially at high, latch circuit 25 keeps and locks terminal Vo at high. If terminal Vo is initially at low, PMOS 29 is not turned on and there is no device controlling the voltage level of terminal Vo, such that terminal Vo is floating and generally stays at low. Thus, output state of logic cell 20 is preserved by latch circuit 25.

Second Embodiment

Figure 3:
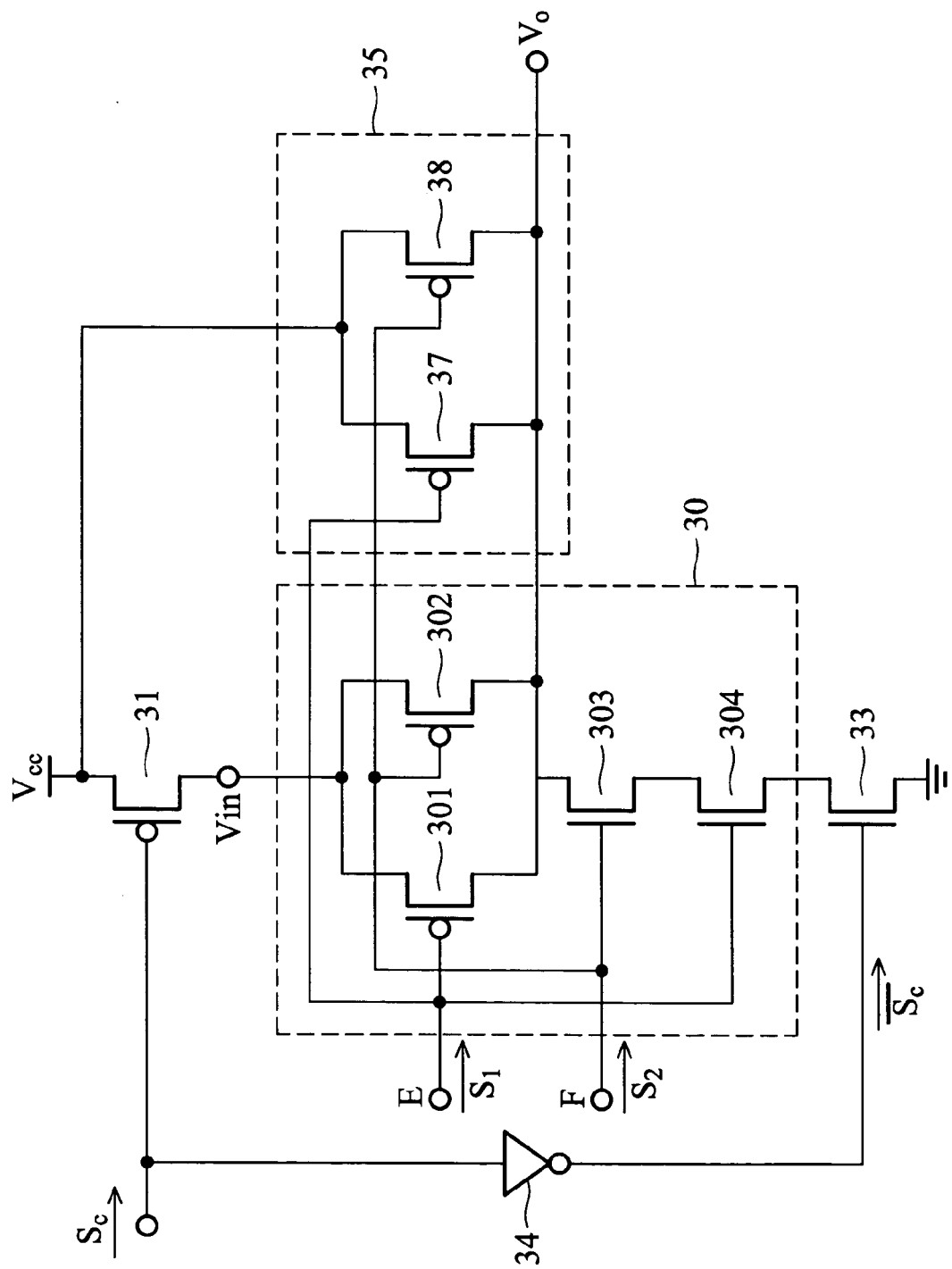
FIG. 3 is a circuit diagram of a power management circuit according to a second embodiment of the present invention.

FIG. 3 is a circuit diagram of a power management circuit according to a second embodiment of the present invention. As shown here, the circuit diagram shows a logic cell 30, a folding latch circuit 35, a PMOS transistor 31 (head switch), an NMOS transistor 33 (foot switch), and a power voltage Vcc. Logic cell 30 comprises input signal terminals E and F, an output terminal Vo, and a power input terminal Vin. Additionally, for the embodiment of FIG. 3, logic cell 30 further comprises two PMOS transistors 301 and 302, and two NMOS transistors 303 and 304. Folding latch circuit 35 comprises two PMOS transistors 37 and 38. The power management circuit, according to the second embodiment of the present invention, switches logic cell 30 between normal and standby modes according to a power control signal Sc.

PMOS transistor 301 includes a gate coupled to signal input terminal E for receiving input signal S1. PMOS transistor 301 further includes a source coupled to the drain of PMOS transistor 31. Additionally PMOS transistor 301 includes a drain. PMOS transistor 302 includes a gate coupled to signal input terminal F for receiving input signal S2. PMOS transistor 302 further includes a source coupled to the drain of PMOS transistor 31. Also, PMOS transistor 302 includes a drain coupled to the drain of PMOS transistor 301. Here, the connection point of the drains of PMOS transistors 301 and 302 is the output terminal Vo. NMOS transistor 303 includes a gate coupled to signal input terminal F. NMOS transistor 303 further includes a drain coupled to output terminal Vo. Moreover, NMOS transistor 303 includes a source. NMOS transistor 304 includes a gate coupled to signal input terminal E. NMOS transistor 304 further includes a drain coupled to the source of NMOS transistor 303. Furthermore, NMOS transistor 304 includes a source coupled to the source of NMOS transistor 33.

PMOS transistor 31 (head switch) is coupled between Vcc and the power input terminal Vin. The gate of the PMOS transistor 31 receives the power control signal Sc. NMOS transistor 33 (foot switch) is coupled between a ground voltage and logic cell 30. PMOS transistor 31 is turned off to disconnect a current path between logic cell 30 and Vcc. Inverter 34 is connected between the gate of PMOS transistor 31 and the gate of NMOS transistor 33. Inverter 34 inverts the power control signal Sc to a reverse power control signal $\overline{Sc}$. The reverse power control signal $\overline{Sc}$ is applied to the gate of the NMOS transistor 33. Thus, when Sc is low, PMOS transistor 31 and NMOS transistor 33 are turned off to disconnect the current path between Vcc and ground. Consequently, logic cell 30 operates in standby mode.

Folding latch circuit 35 is coupled to the Vcc, signal input terminals E and F, and the output terminal Vo of logic cell 30. The folding latch circuit 35 preserves the voltage level of the output terminal Vo. PMOS transistor 37, of the folding latch circuit 35, includes a gate coupled to signal input terminal E. PMOS transistor 37 further includes a source coupled to power voltage Vcc. Also, PMOS transistor 37 includes a drain coupled to the output terminal Vo. PMOS transistor 38 includes a gate coupled to signal input terminal F. PMOS transistor 38 further includes a source coupled to Vcc. Furthermore, PMOS transistor 38 includes a drain coupled to the output terminal Vo. Here, the threshold voltages of NMOS transistor 33 and PMOS transistors 31, 37 and 38 are higher than the threshold voltages of NMOS transistors 303 and 304. Additionally, the threshold voltages of NMOS transistor 33 and PMOS transistors 31, 37 and 38 are higher than the threshold voltages of PMOS transistors 301 and 302. Alternatively, the oxide layers NMOS transistor 33 and PMOS transistors 31, 37 and 38 are thicker than those of NMOS transistors 303 and 304 and PMOS transistors 301 and 302.

When power control signal Sc is low, PMOS transistors 31 and NMOS transistors 33 are turned on. Thus, logic cell 30 outputs data with a predetermined logic level from output terminal Vo, according to input signals S1 and S2, respectively, which are applied to input signal terminals E and F. When power control signal Sc goes high, PMOS transistor 31 and NMOS transistor 33 are turned off. Thus, logic cell 30 operates in standby mode. In addition, if input signal S1, applied to input signal terminal E, is high and input signal S2, applied to input signal terminal F, is low, then the output terminal Vo is driven high. As described above, due to current leakage, the logic level of output terminal Vo decreases when power voltage Vcc is disconnected from logic cell 30 in standby mode. However, the logic level of output terminal Vo is maintained by the power voltage Vcc through the PMOS transistor 38 when PMOS transistor 38 is turned on. Thus, output state of logic cell 30 is preserved by folding latch circuit 35.

In the embodiments of the present invention, the transistors 21, 23, 31 and 33, and the transistors of latch circuits 25 and 35 are fabricated with high threshold voltage and thicker gate oxide process. The high threshold voltage reduces their subthreshold leakage current and the thicker gate oxide reduces their gate leakage current during standby mode.

Accordingly, the power management circuits of the disclosed embodiments do not change normal operation of the logic cells in normal mode. In addition, head switch is turned off to disconnect the logic cells from the power supply. Thus, the subthreshold leakage and gate leakage of the logic cells are prevented. Furthermore, the output state of the logic cell is preserved by the latch circuit, such that high state and low state will be sustained. When the circuit returns to normal operation, the logic cell resumes normal operation without interruption. Thus, the advantages of the present invention are relatively simple circuit design, alleviated subthreshold and gate leakage, reduced signal variation during normal circuit operation, preserved normal operation circuit states, no vector dependence and transparent power saving for circuit design.

The foregoing description of the preferred embodiments have been presented for purposes of illustration and description. Obvious modifications or variations are possible in light of the above teaching. The embodiments were chosen and described to provide the best illustration of the principles of the invention and its practical application to thereby enable those skilled in the art to utilize the various embodiments and their various modifications, as are suited to the particular use contemplated. All such modifications and variations are within the scope of the present invention.

What is claimed is:

1. A power management circuit for a logic cell, the logic cell comprising an output terminal, a power input terminal, a first signal input terminal and a second signal input terminal, the power management circuit for switching the logic cell between normal mode and standby modes according to a power control signal, the power management circuit comprising:
    a first switch coupled between a power voltage, the power control signal and the power input terminal, wherein the first switch is turned off to disconnect the power voltage and the logic cell when the power control signal is at a predetermined level, such that the logic cell operates in standby mode; and
    a latch circuit electrically connected between the power voltage, the first signal input terminal, the second signal input terminal and the output terminal to preserve the voltage level of the output terminal when the logic cell operates in the standby mode.

2. The power management circuit as claimed in claim 1, wherein the first switch is a first PMOS transistor having a first gate coupled to the power control signal, a first source coupled to the power voltage, and a first drain coupled to power input terminal.

3. The power management circuit as claimed in claim 2, wherein the predetermined level is a high logic level.

4. The power management circuit as claimed in claim 3, further comprising a second switch coupled between the logic cell and a ground voltage, wherein the second switch is an open circuit when the power control signal is at the predetermined level.

5. The power management circuit as claimed in claim 4, wherein the second switch is a first NMOS transistor having a second gate coupled to a reverse power control signal, a second source coupled to the ground voltage, and a second drain.

6. The power management circuit as claimed in claim 5, further comprising an inverter coupled between the first gate and the second gate.

7. The power management circuit as claimed in claim 6, wherein the logic cell comprises:
    a second PMOS transistor comprising a third gate coupled to the first signal input terminal, a third source coupled to the first drain, and a third drain;
    a third PMOS transistor comprising a fourth gate coupled to the second signal input terminal, a fourth source coupled to the first drain, and a fourth drain coupled to the third drain, wherein the connection point of the fourth drain and the third drain is the output terminal;
    a second NMOS transistor comprising a fifth gate coupled to the second signal input terminal, a fifth drain coupled to the output terminal, and a fifth source; and
    a third NMOS transistor comprising a sixth gate coupled to the first signal input terminal, a sixth drain coupled to the fifth source, and a sixth source coupled to the second source.

8. The power management circuit as claimed in claim 7, wherein the latch circuit comprises:
    a fourth PMOS transistor comprising a seventh gate coupled to the first signal input terminal, a seventh source coupled to the power voltage, and a seventh drain coupled to the output terminal; and a fifth PMOS transistor comprising an eighth gate coupled to the second signal input terminal, an eighth source coupled to the power voltage, and an eighth drain coupled to the output terminal.

9. The power management circuit as claimed in claim 8, wherein the second PMOS transistor, the third PMOS transistor, the second NMOS transistor and the third NMOS transistor each comprises a first gate oxide layer and a first threshold voltage.

10. The power management circuit as claimed in claim 9, wherein the first NMOS transistor, the first PMOS transistor, the fourth PMOS transistor and the fifth PMOS transistor each comprises a second gate oxide layer thicker than the first gate oxide layer.

11. The power management circuit as claimed in claim 9, wherein the first NMOS transistor, the first PMOS transistor, the fourth PMOS transistor and the fifth PMOS transistor each has a second threshold voltage higher than the first threshold voltage.

12. The power management circuit as claimed in claim 1, wherein the latch circuit is directly connected to the first signal input terminal and the second signal input terminal.

* * * * *